US010400994B2

(12) United States Patent
Stopa et al.

(10) Patent No.: US 10,400,994 B2
(45) Date of Patent: Sep. 3, 2019

(54) LED ILLUMINATION MODULE WITH FIXED OPTIC AND VARIABLE EMISSION PATTERN

(71) Applicant: Whelen Engineering Company, Inc., Chester, CT (US)

(72) Inventors: James L. Stopa, East Hampton, CT (US); Todd J. Smith, Deep River, CT (US)

(73) Assignee: Whelen Engineering Company, Inc., Chester, CT (US)

( * ) Notice: Subject to any disclaimer, the term of this patent is extended or adjusted under 35 U.S.C. 154(b) by 101 days.

(21) Appl. No.: 15/383,469

(22) Filed: Dec. 19, 2016

(65) Prior Publication Data

US 2018/0172242 A1 Jun. 21, 2018

(51) Int. Cl.

| | |
|---|---|
| ***F21V 5/00*** | (2018.01) |
| ***F21V 7/00*** | (2006.01) |
| ***F21V 13/04*** | (2006.01) |
| ***F21Y 113/13*** | (2016.01) |
| ***F21Y 115/10*** | (2016.01) |

(Continued)

(52) U.S. Cl.

CPC .............. *F21V 13/04* (2013.01); *F21S 8/003* (2013.01); *F21V 5/00* (2013.01); *F21V 7/0091* (2013.01); *F21V 9/30* (2018.02); *F21Y 2113/13* (2016.08); *F21Y 2115/10* (2016.08)

(58) Field of Classification Search

CPC . F21V 7/0091; F21Y 2113/10; F21Y 2113/17

See application file for complete search history.

(56) References Cited

U.S. PATENT DOCUMENTS

| | | | |
|---|---|---|---|
| 4,755,916 | A | 7/1988 | Collins |
| 6,547,249 | B2 | 4/2003 | Collins, III et al. |

(Continued)

FOREIGN PATENT DOCUMENTS

| | | | |
|---|---|---|---|
| DE | 102012201494 | A1 | 8/2012 |
| WO | 2009059461 | A1 | 5/2009 |

(Continued)

OTHER PUBLICATIONS

Setlur, Anant A., "Phosphors for LED-based Solid-State Lighting," The Electrochemical Society, Interface, Winter 2009.

(Continued)

*Primary Examiner* — William N Harris

(74) *Attorney, Agent, or Firm* — Alix, Yale & Ristas, LLP

(57) ABSTRACT

An LED illumination module including an LED lamp with a plurality of light emitting dies on a substrate in combination with an optic having a single focus. The light emitting dies include a single center light emitting die centered on an optical axis and peripheral dies arranged around the center die. The illumination module includes a beam forming optic having a single focus arranged over the LED lamp with the focus on the optical axis of the center die. Light emitted from the center die is substantially collimated by the optic in a focused "spot" emission pattern. Light emitted from the peripheral dies results in a more dispersed or divergent "flood" emission pattern. The center die and peripheral dies are independently controlled and the power delivered to the dies can be varied independently to generate different light emission patterns using the same optic.

11 Claims, 4 Drawing Sheets

(51) Int. Cl.

| | |
|---|---|
| ***F21S 8/00*** | (2006.01) |
| ***F21V 9/30*** | (2018.01) |

(56) References Cited

U.S. PATENT DOCUMENTS

| | | | | | |
|---|---|---|---|---|---|
| 6,866,401 | B2 | 3/2005 | Sommers et al. | | |
| 7,461,948 | B2 | 12/2008 | van Voorst Vader et al. | | |
| 7,652,274 | B2 | 1/2010 | Wernersson | | |
| 7,806,558 | B2 * | 10/2010 | Williamson | F21V 7/0091 | 362/237 |
| 8,680,753 | B2 | 3/2014 | Oechsle et al. | | |
| 8,729,571 | B2 | 5/2014 | Daschner et al. | | |
| 8,947,527 | B1 | 2/2015 | Postovalov et al. | | |
| 9,341,934 | B2 | 5/2016 | De Sisti et al. | | |
| 2009/0296407 | A1 * | 12/2009 | Bailey | F21V 5/04 | 362/309 |
| 2010/0295481 | A1 * | 11/2010 | Van Endert | H03K 17/96 | 315/312 |
| 2011/0182065 | A1 * | 7/2011 | Negley | F21V 5/04 | 362/231 |
| 2012/0138977 | A1 | 6/2012 | Li | | |
| 2012/0189291 | A1 | 7/2012 | von Malm et al. | | |
| 2013/0088142 | A1 * | 4/2013 | Allen | F21K 9/62 | 313/498 |
| 2013/0170220 | A1 * | 7/2013 | Bueeler | F21K 9/00 | 362/296.01 |
| 2013/0214696 | A1 | 8/2013 | Huang et al. | | |
| 2013/0270585 | A1 * | 10/2013 | Mei | H01L 25/0753 | 257/89 |
| 2014/0084809 | A1 * | 3/2014 | Catalano | H05B 33/0845 | 315/292 |
| 2015/0228876 | A1 | 8/2015 | Place et al. | | |
| 2016/0061389 | A1 * | 3/2016 | Dong | F21V 13/04 | 362/297 |
| 2016/0116723 | A1 * | 4/2016 | Hukkanen | G02B 3/08 | 362/329 |
| 2016/0169458 | A1 | 6/2016 | Catalano | | |
| 2017/0059120 | A1 * | 3/2017 | Kataoka | F21V 29/74 | |
| 2017/0067621 | A1 * | 3/2017 | Anselm | G02B 19/0066 | |
| 2017/0114980 | A1 | 4/2017 | Madril | | |
| 2018/0313519 | A1 * | 11/2018 | Lacroix | G02B 19/0066 | |

FOREIGN PATENT DOCUMENTS

| | | | |
|---|---|---|---|
| WO | 2011144597 | A2 | 11/2011 |
| WO | 2014047621 | A1 | 3/2014 |

OTHER PUBLICATIONS

International Search Report and Written Opinion dated Mar. 20, 2018 (PCT/US2017/067364).

* cited by examiner

LED ILLUMINATION MODULE WITH FIXED OPTIC AND VARIABLE EMISSION PATTERN

BACKGROUND

Light emitting diodes (LEDs) are now the standard light source for a wide variety of illumination, warning, and signaling devices. LEDs include a semiconductor die (or chip) which emits light of a pre-determined wavelength (color) when energized by electrical power. The light emitting die is typically placed on a heat transmissive support, provided with conductive contacts to connect the die to an electrical circuit and may include a primary optic. The assembly of a light emitting die, heat transmissive support, electrical connections and primary optic (if present) may be referred to as an LED lamp. LED lamps in a variety of colors and light generating capacities are generally available. In some cases, several light emitting dies are placed on a common heat transmissive support. The light emitting dies may be of the same color or different colors. Some LED lamps provide primary color mixing necessary for color displays, with light emitting dies for each of the colors on a common support.

Light emitting dies emit light away from the heat transmissive support in a divergent pattern surrounding an optical axis passing through a center of the light emitting die. An LED lamp may include a primary optic that modifies the pattern of light emitted from the die or dies, but all LED lamps are "directional" light sources in that light is emitted in a direction away from the heat transmissive support. Lighting devices produce different light emission patterns suited to the purpose of the lighting device. Common light emission patterns include a collimated beam (spot), and evenly distributed (flood) patterns. Other emission patterns of partially collimated beams and shaped light emission patterns are also employed for particular purposes. Lighting devices include optical assemblies of lenses and/or reflectors to modify the light emission pattern of LED lamps to produce the desired light emission pattern. The optical assemblies are commonly constructed around a focal point or focal axis, and light emitted from the focal point or focal axis is handled accurately by the optical assembly. Light emitted at positions offset from the focal point or axis of the assembly is emitted from the assembly in an emission pattern that is different from the designed emission pattern. The ability of optical assemblies to generate a specific emission pattern is somewhat compromised by the fact that each light emitting die has an area, and light emitted from areas of the die spaced from the center of the die is offset from the optical focus or focal axis of the optical assembly. Large light emitting dies and large substrates with multiple dies may exaggerate this effect, which generally results in a blurred emission pattern.

Some lighting devices are configured to generate more than one light emission pattern. For example, a flashlight may be designed to emit both a focused beam (spot) and a diffuse (flood) light emission patterns. This is typically accomplished by moving the optical assembly relative to a single light source, which alters the pattern of light emitted. Other lighting devices may include multiple light sources, each with its own dedicated optical assembly and operate different light sources to generate specific patterns of light emission. Multiple optical assemblies can be costly to manufacture and may not be possible within the constraints applicable to a specific lighting device configuration.

There is a need in the art for lighting devices that can generate different light emission patterns utilizing the same stationary optical assembly with a single focus.

SUMMARY OF THE INVENTION

One embodiment of an LED illumination module according to the disclosure includes an LED lamp with a plurality of light emitting dies on a substrate in combination with an optic having a single focus. The light emitting dies include a single center light emitting die or a central group of light emitting dies centered on an optical axis. The light emitting dies on the substrate also include one or more peripheral dies arranged around the center die or group of dies. The illumination module includes a beam forming optic having a single focus. The optic is arranged over the LED lamp with the focus of the optic on the optical axis of the center die or central group of dies and in a plane with the central die or group of dies. Light emitted from the central die, or group of dies is substantially collimated by the optic and is emitted in a focused "spot" emission pattern. Light emitted from the one or more peripheral dies is emitted from areas spaced apart from the focus of the optic and is emitted as a more dispersed and divergent "flood" emission pattern. The center die or group of dies and one or more peripheral dies are independently controlled, so a spot or flood emission pattern can be generated from the same optic by switching between the center die(s) and peripheral die(s). Alternatively, the power delivered to the center die(s) and peripheral die(s) can be varied independently to generate light emission patterns from a spot (only center die(s) on) to a spot/flood (all die(s) on) to a flood (only peripheral die(s) on), with no moving parts and using the same optic with a single focus.

The peripheral die may be a single epitaxial die surrounding the center die. Alternatively, the disclosed LED illumination module may be constructed using a plurality of dies forming a group at the center of the substrate and a plurality of dies arranged around the center group. Subsets of the peripheral dies may be configured to receive energy together, or all the peripheral dies may receive energy at the same time. Light from peripheral dies is emitted with a trajectory toward the diametrically opposite side of the light emission pattern, so energizing peripheral dies or groups of peripheral dies in sequence can generate a moving light emission pattern. Colored light emission from a row of LED illumination modules can be balanced by placing one die of each color at the focus of the optic and ensuring equal numbers of that color die in each of the peripheral positions.

DETAILED DESCRIPTION

Figure 1:
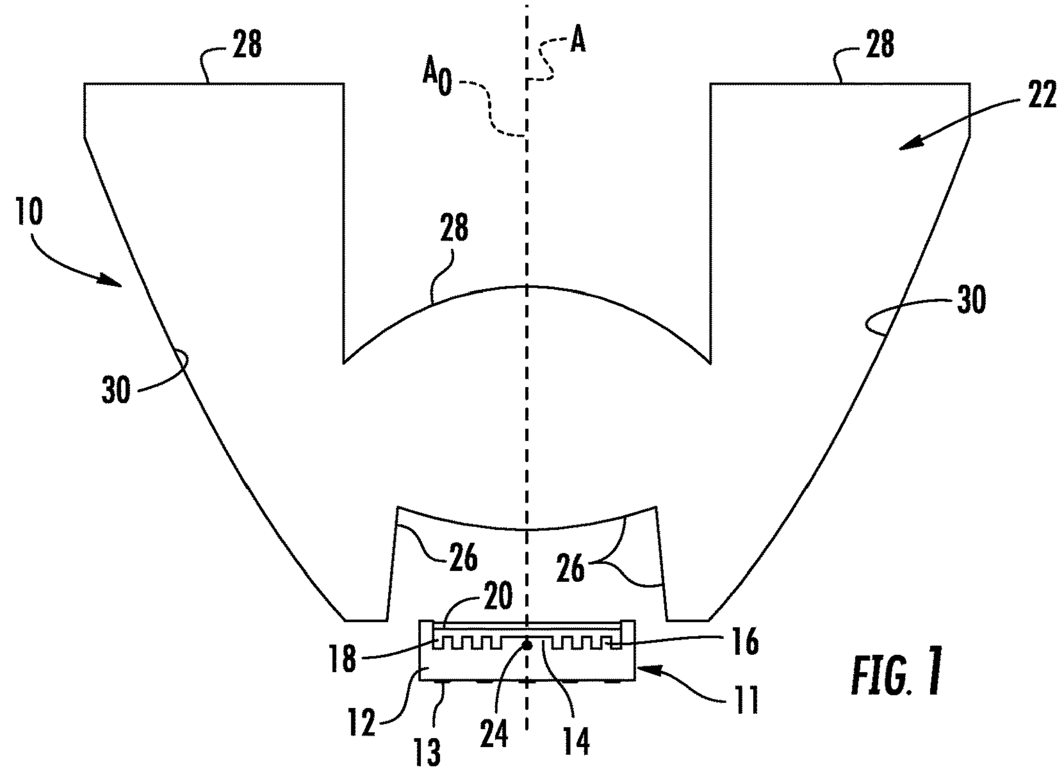
FIG. 1 is a sectional view through an LED illumination module according to aspects of the disclosure.

FIG. 1 is a sectional view through a first embodiment of an LED illumination module 10 incorporating aspects of the disclosure. An LED lamp 11 includes a ceramic substrate 12 configured to support multiple light emitting dies. Conductive pads 13 on the bottom of the substrate connect the light emitting dies to electrical circuits on a printed circuit board (not shown). In this embodiment, a single, relatively large light emitting center die 14 is positioned in the center of the ceramic substrate 12. The center die 14 in this embodiment is a square die with 1 mm sides. The center die 14 is surrounded by many small square peripheral dies 16 of about 0.2 mm a side. The shape of each die 14, 16 can be different from the disclosed square and the relative size difference between the center die 14 and the peripheral dies 16 may vary from the disclosed relationship. A YAG phosphor may be employed to convert short (blue, violet) wavelength light radiated from the light emitting dies into amber, red and white light. The YAG phosphor may be dispersed in an epoxy resin 18 or other carrier and fill the area between and above the light emitting dies 14, 16 as shown in FIG. 1. The dies 14, 16 and phosphor/epoxy 18 may be covered by an optically clear silicone encapsulant 20 for protection.

A single optic 22 is supported above the LED lamp 11 in a position to collect substantially all light generated by the center light emitting die 14 and peripheral light emitting dies 16. The optic 22 is rotationally symmetrical about axis A, has a single focus 24, and is configured to collimate light generated at the focus 24 into a direction parallel with an axis A at the center of the optic 22. The term "collimate" is used in this application to mean "make substantially parallel with" a reference line or plane. It will be understood by those skilled in the art that the tolerances of optical elements and the fact that light emitting dies are not true point light sources mean that light emitted from an LED light source through a collimating optic will be substantially collimated, with some light having an emitted trajectory that is not precisely parallel with the reference line or plane. The disclosed optic 22 is a circular optic of the total internal reflecting (TIR) type, which uses a combination of refracting light entry surfaces 26 and light emission surfaces 28, in cooperation with internal reflecting surfaces 30 to alter the trajectory of light radiated from the light emitting dies 14, 16 of the LED lamp 11 into trajectories resulting in predetermined light emission patterns as described in greater detail below. Alternative optics may employ metalized reflecting surfaces in combination with a lens to re-direct light radiated from the light emitting dies 14, 16 to produce similar light emission patterns. Generally speaking, a collimating optic reduces the divergence of light radiated from a light emitting die relative to an axis or plane passing through the center of the light emitting die. An optic that collimates light relative to a line (typically referred to as an axis) forms a spot light beam form of emission with less than 20° of divergence from the line, preferably approximately 10°. An optic that collimates light relative to a plane reduces the divergence of radiated light relative to a plane, but allows divergence in directions parallel with the plane, resulting in a beam that is visible over a range of vantage points in or near the plane.

Figure 1A:
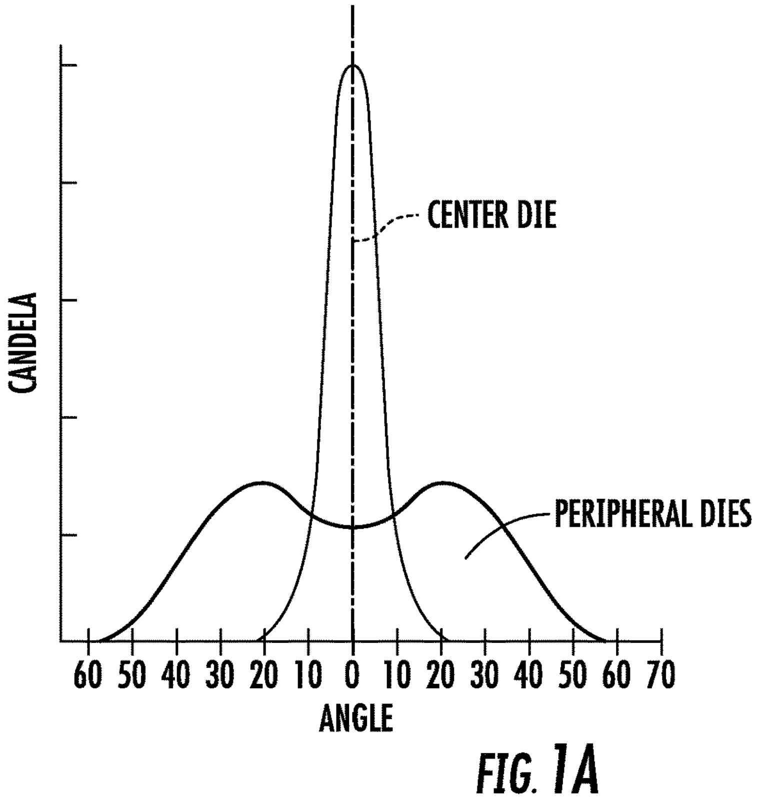
FIG. 1A is a graphical representation of the light emission patterns available from the LED illumination module of FIG. 1.
Figure 2:
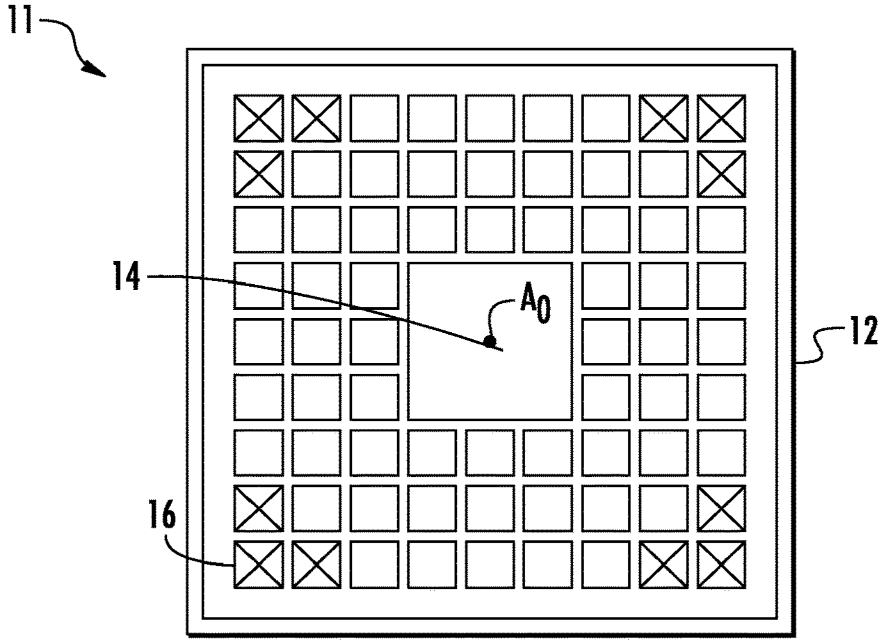
FIG. 2 is a top view of the LED lamp used in the LED illumination module of FIG. 1.

In LED lamp 11 of FIGS. 1 and 2, the center light emitting die 14 is a 1 mm square and has an optical axis passing through the center of the die. The center die is positioned so that the optical axis $A_o$ of the center die 14 passes through the focus 24 of the optic 22. Light is radiated over the entire surface of the center die 14 over a range of radiated trajectories that form a hemisphere of light, which may be referred to as a "lambertian" radiation pattern. The physical size of the center die 14 means that some of the light is emitted from positions spaced apart from the optical axis $A_o$ and focus 24 of the optic 22. Substantially all of the light emitted from the center die 14 passes through a refracting surface 26 of the optic and is accepted into the light transmissive material of the optic 22, which may be constructed of materials such as silicone, polycarbonate, acrylic or glass. Once inside the optic 22, light moves according to well-understood principles such as Snell's law. Light incident upon the internal reflecting surface 30 at the periphery of the optic 22, is reflected into a trajectory according to the direction of the light and its angle of incidence upon the internal reflecting surface 30. In the disclosed embodiment of FIG. 1, the refracting light entry surface 26 and light emission surface 28 at the bottom and top of the optic 22, respectively, cooperate with the internal reflecting surface 30 at the periphery of the optic 22 to alter the radiated trajectory of the light from the center die 14 into an emitted trajectory substantially aligned with the optical axis $A_o$ of the center die 14 (which is coincident with axis A in FIG. 1). The center of FIG. 1A graphically represents the light emission pattern from the center die 14 through the TIR optic 22. The graph shows an emission pattern corresponding to a roughly 10° collimated "spot" beam relative to a center line at 0° coincident with axis A. Alternatively stated, the emission pattern from the center die 14 through a collimating optic 22 results in a beam where substantially all the light is emitted at an angle of 10° or less relative to axis A. The greatest intensity of the beam generated by the center die 14 is at the center of the emission pattern, which resembles a relatively sharp, narrow spike when presented graphically.

FIG. 2 is a top view of the LED lamp 11, showing the ceramic support 12 for the light emitting dies, including the center die 14 and a large number of much smaller peripheral light emitting dies 16 according to aspects of the disclosure. In the disclosed LED lamp 11, the center die 14 and peripheral dies 16 are connected so that the center die 14 can be energized separately from the peripheral dies 16. The peripheral dies 16 may be connected to be energized together as a group, or as subsets that can be energized separately. The peripheral dies 16 are laterally spaced from the optical axis $A_o$ of the center die and also from the focus 24 of the optic 22. This means that light radiated from the peripheral dies 16 will be emitted from the optic 22 not as a collimated beam, but as a more divergent beam as shown in FIG. 1A. When graphically presented, the beam formed by the peripheral dies 16 has a much lower intensity along the axis A, with much of the light emitted over a range of angles diverging up to about 45° relative to axis A. The emission pattern from the peripheral dies 16 may be described as a "flood" light emission pattern. In the disclosed embodiment of FIGS. 1, and 2, the peak intensity of the emission pattern from the peripheral dies 16 is offset from axis A by about 20° as shown in FIG. 1A.

The LED illumination module 10 of FIG. 1 is configured so that the center die 14 and peripheral dies 16 may be energized together, or separately. Further, the intensity of light emission from the center die 14 and the peripheral dies 16 can be modulated to produce light emission patterns from a focused spot to a wide angle flood. For example, the center die 14 can be energized at a reduced level as needed to fill the center of a flood emission pattern generated by the peripheral dies 16. Generally, a spot light emission pattern is used to illuminate subjects far away, or to generate warning light signals visible at a great distance as in a light house. A flood light emission pattern may be used to illuminate a construction work area or the like. The LED illumination module 10 of FIG. 1 can provide spot, flood or various emission patterns blending the two from a single optic 22 with a single focus 24 and using no moving parts.

The arrangement of peripheral dies is not limited to the same shape as the center die. For example, the peripheral dies 16 in FIG. 2 are arranged in a square shape around the square center die 14. Three dies may be removed from the corners of the arrangement of peripheral dies 16, as shown by the "x" through these dies in FIG. 2. Removal of the three peripheral dies 16 at the corners of the support will result in a more rounded light emission pattern from the optic 22.

Figure 3:
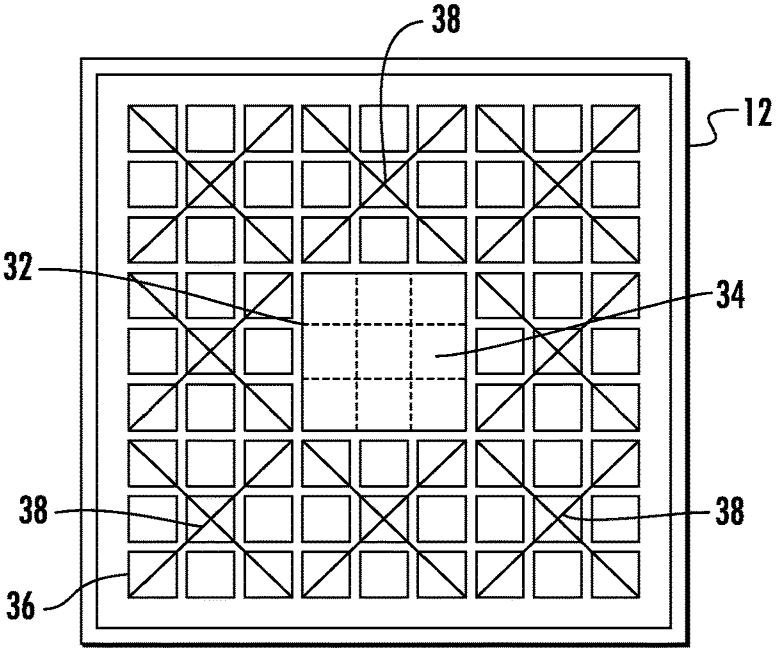
FIG. 3 is an alternative LED lamp compatible with the disclosed LED illumination module according to the disclosure.

FIG. 3 is a top view of a ceramic support 12 illustrating an alternative pattern of light emitting dies, with the "center" light emitting die 32 made up of 9 smaller dies 34. In this embodiment, the group of 9 dies 34 immediately surrounding the center of the support is configured to be energized together as a center group 32, with the peripheral dies 36 surrounding this center group configured to be energized together or in subsets 38. In FIG. 3, crossed lines connect groups of 9 peripheral dies 36 into a subset 38 that is connected to be energized together. Subsets may include equal numbers of dies as shown in FIG. 3, or unequal numbers of dies. The support 12 and light emitting dies 34, 36 will function as described above with respect to the embodiment of FIGS. 1 and 2 and differ only with respect to the construction of the center die as a center group 32 and grouping of peripheral dies 36.

Figure 4A:
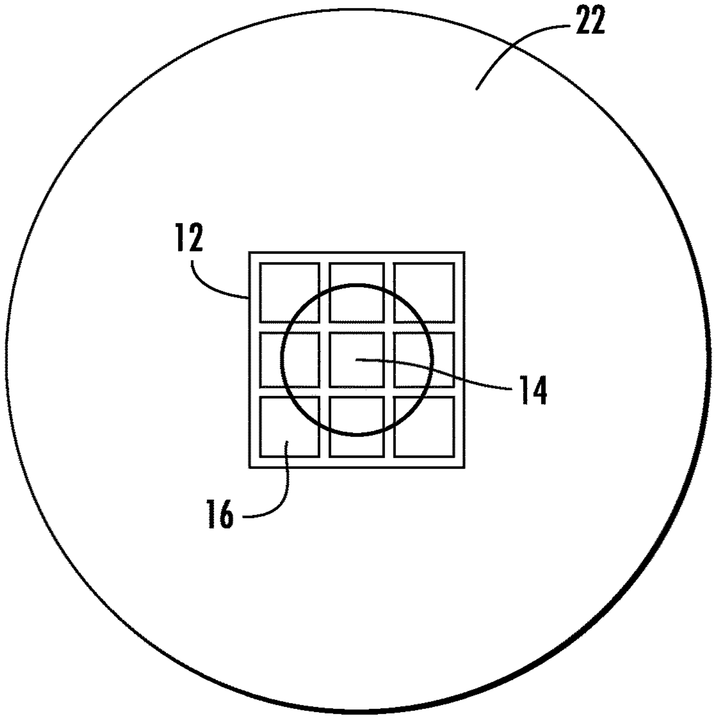
FIG. 4A is a front view schematic representation of an alternative embodiment of an LED illumination module according to aspects of the disclosure.

FIG. 4A illustrates an alternative grouping of light emitting dies, with 8 peripheral dies 16 surrounding a center die 14. A TIR optic 22 is shown schematically in front of the dies 14, 16. The center die 14 and peripheral dies 16 are configured to be separately energized. In some embodiments, each of the dies 14, 16 could be operated separately and the energy applied to each die may be varied to produce different light emission patterns. Light radiated from each of the peripheral dies 16 is emitted from the optic 22 along trajectories that reinforce the emission pattern diametrically across from the energized peripheral die 16. For example, light from the peripheral die 16 in the upper left corner of the substrate 12 of FIG. 4A contributes to the lower right portion of the flood light emission pattern. Light from the top center peripheral die 16 contributes to a flood light emission at the bottom center of the flood light emission pattern. It will be noted that energizing each of the 8 peripheral dies 16 in a rotating sequence will generate a swirling emission pattern. Energizing the peripheral dies 16 in a left-right or up-down pattern will generate a corresponding oppositely moving light emission pattern from the optic 22.

Figure 4B:
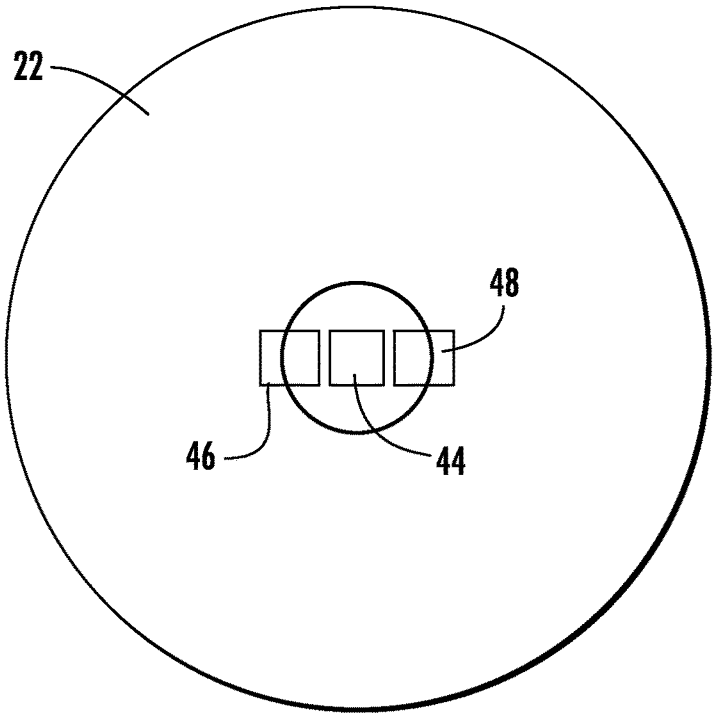
FIG. 4B is a front view schematic representation of a further alternative embodiment of an LED illumination module according to aspects of the disclosure.

FIG. 4B illustrates three LED lamps 44, 46, 48 closely grouped behind a TIR optic 22. Those skilled in the art will recognize that light emitting dies can be arranged on a common substrate as shown in FIGS. 1, 2 and 3 or on separate substrates as shown in FIG. 4B. When referenced in this disclosure and the appended claims, reference to a "light emitting die" may refer to a die on a common support or a die on a separate support. Each LED lamp 44, 46, 48 includes its own substrate, electrical connections, light emitting die, and primary optic (if present). The optical axis of the center LED lamp 44 is situated along the focus of the optic 22, so light radiated from the center LED lamp is focused into a collimated beam, subject to the size of the die and the accuracy of the optic 22 as discussed above. One peripheral LED lamp 46 is positioned to the left and one peripheral LED lamp 48 is positioned to the right of the center LED lamp 44. In this arrangement, light radiated from the left peripheral LED lamp 46 contributes to the right side of the flood light emission pattern, and light radiated from the right peripheral LED lamp 48 contributes to the left side of the flood light emission pattern. Energizing all three of the LED lamps 44, 46, 48 in this embodiment would generate a spot beam flanked by flood emission to the left and right, with relatively little emission above or below a horizontal plane through the three LED lamps 44, 46, 48.

Figure 5:
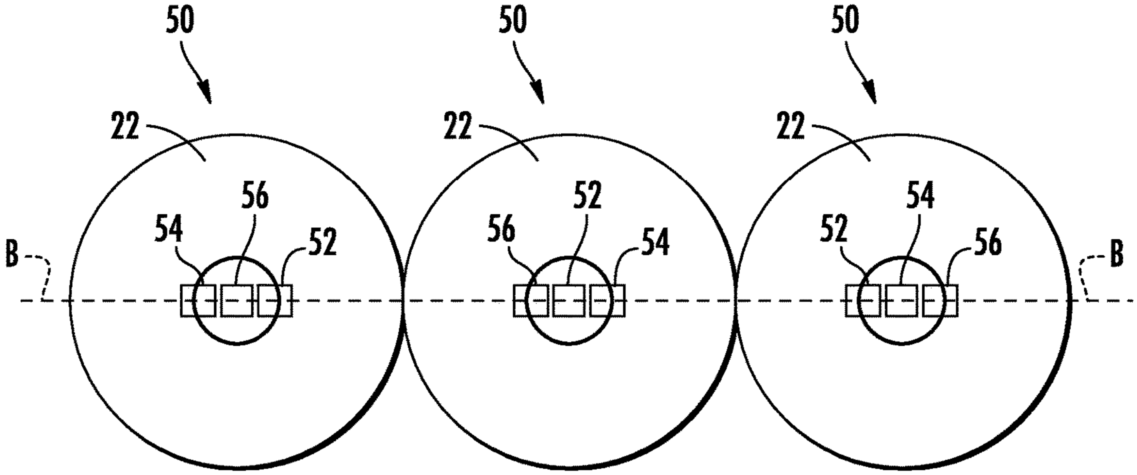
FIG. 5 is a front view schematic representation of a row of LED illumination modules according to aspects of the disclosure.

FIG. 5 illustrates a row of LED illumination modules 50 according to aspects of the disclosure, each LED illumination module 50 having three LED lamps 52, 54, 56 arranged in a row behind a TIR optic 22, similar to that shown in FIG. 4B. The rows of LED lamps 52, 54, 56 are aligned along a common axis B, with groups of three (or more) LED illumination modules 50 mountable together to form a light emitting bar (not shown) useable as a signaling device. In this embodiment, each LED lamp 52, 54, 56 is of a different color. By way of example, in each set of three LED lamps, one die is amber 52, one die is blue 54 and one die is red 56. As discussed above, only the center die will generate a focused beam, with the other dies supplementing a less focused emission diametrically across the emission pattern. In a lighting system designed to generate three colors, putting any one of the colors in the center of all three TIR optics 22 would mean the other two colors are always out of focus and the light emission pattern will be unbalanced. In the embodiment of FIG. 5, one die of each color is arranged at the focus of each TIR optic. In the two TIR optics where a color is not in the center position, the color is once in the left position and once in the right position. This pattern of three colored light emitting dies will generate a balanced emission pattern when each color is energized, with one die in the center position, one die in the right position and one die in the left position.

Figure 6:
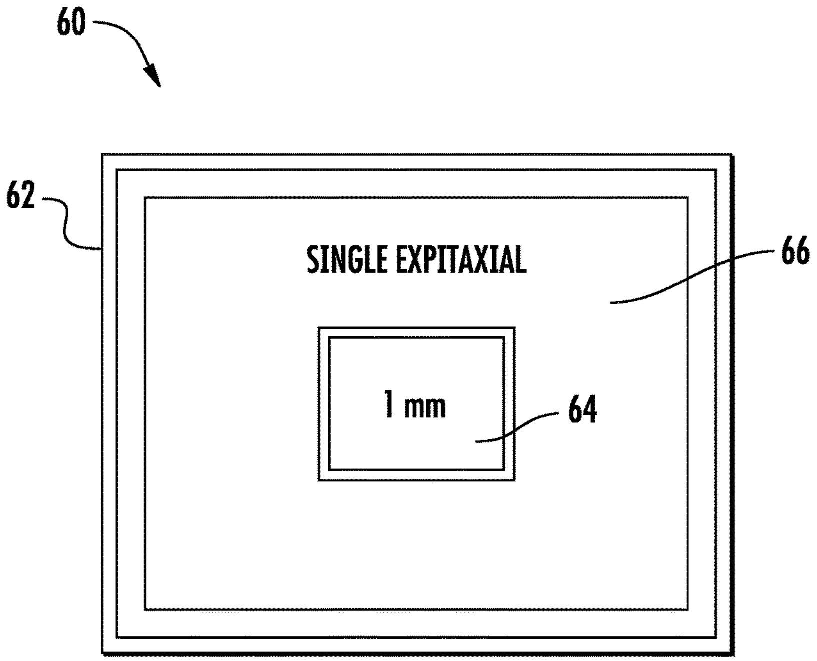
FIG. 6 is a top plan view of an alternative LED lamp compatible with the disclosed LED illumination modules according to aspects of the disclosure.

FIG. 6 illustrates a concept for an LED lamp 60 according to aspects of the disclosure. A light emitting die 64 at the center of a support 62 is surrounded by a peripheral die 66 in the form of a single epitaxial light emitting die. In this configuration, the center die 64 and peripheral die 66 are separately controlled. The energy delivered to the center die 64 and peripheral die 66 can be varied to produce light emission patterns from a spot beam to a flood light emission pattern, with the properties of the respective emission patterns dependent upon the optic handling the light. This embodiment can generate spot, flood, combination spot/flood or variations between them without moving parts and through a single optic having a single focus.

What is claimed:

1. An LED light assembly comprising:

a first beam forming optic and a second beam forming optic, each of said first and second beam forming optics having a focus, said foci intersected by a linear axis;

a first light emitting die and a second light emitting die, said first and second light emitting dies arranged to emit light into said first beam forming optic and said second beam forming optic, said first light emitting die emitting light of a first or second color and having an optical axis passing through the focus and said second light emitting die emitting light of the other of said first or second color and having an optical axis offset from the focus and intersecting said linear axis;

wherein said first light emitting die emits light of the first color into said first beam forming optic, said first light emitting die emits light of the second color into said second beam forming optic, and said light emitting dies emitting light of said first color are energized at the same time so that light of the first color is emitted at the focus of the first beam forming optic and offset from the focus of the second beam forming optic and said light emitting dies emitting light of said second color are energized at the same time so that light of the second color is emitted at the focus of the second beam forming optic and offset from the focus of the first beam forming optic.

2. The LED light assembly of claim 1, wherein said first light emitting die is larger than said second light emitting die.

3. The LED light assembly of claim 1, wherein energy applied to each of said light emitting dies emitting light of the same color is varied independently of the other light emitting dies emitting light of the same color.

4. The LED light assembly of claim 2, wherein energy applied to each of said light emitting dies emitting light of the same color is varied independently of the other light emitting dies emitting light of the same color.

5. A method of generating light emission patterns of different colors, said method comprising:

providing a plurality of light generating modules, each said module comprising:

an optic having a focus, said optic configured to collimate light emitted from said focus;

a plurality of light emitting dies arranged to emit light into said optic, said plurality of light emitting dies including a first die emitting light of a first color or a second color having an area of light emission centered on the focus and at least one second die emitting light of the other of said first color or said second color having an area of light emission offset from the focus, arranging said plurality of light generating modules and said second die so that each focus of said plurality of light generating modules and the area of light emission of said second die are intersected by a linear axis;

selecting the first die to emit light of the first color in a first pre-determined number of said plurality of light generating modules; and selecting the first die to emit light of the second color in a second pre-determined number of said plurality of light generating modules, wherein said plurality of light emitting dies of the first color are energized at the same time and said plurality of light emitting dies of the second color are energized at the same time.

6. The method of generating light emission patterns of different colors of claim 5, comprising the step of varying energy applied to each of said light emitting dies emitting light of the same color independently of the other light emitting dies emitting light of the same color.

7. The LED light assembly of claim 1, comprising a third beam forming optic having a focus and a third light emitting die arranged to emit light into each beam forming optic, said third light emitting die having an optical axis offset from the focus of each beam forming optic and intersecting said linear axis, wherein said first light emitting die is positioned intermediate said second light emitting die and said third light emitting die, said first, second, and third light emitting dies emit light of said first and second color and a third color, and said optical axis of the first light emitting die of a third color passes through the focus of said third beam forming optic.

8. The LED light assembly of claim 7, wherein the color not emitted at said focus is emitted offset from the focus of one beam forming optic in a first direction and emitted offset from the focus of another beam forming optic in a second direction opposite said first direction.

9. The LED light assembly of claim 7, wherein said light emitting dies emitting light of said first color are energized at the same time so that light of the first color is emitted at the focus of the first beam forming optic and offset from the focus of the second and third beam forming optic, said light emitting dies emitting light of said second color are energized at the same time so that light of the second color is emitted at the focus of the second beam forming optic and offset from the focus of the first and third beam forming optic, and said light emitting dies emitting light of said third color are energized at the same time so that light of the third color is emitted at the focus of the third beam forming optic and offset from the focus of the first and second beam forming optic to generate a balanced emission pattern.

10. The method of generating light emission patterns of different colors of claim 5, wherein said step of providing further comprises said plurality of light emitting dies including a third light emitting die having an optical axis offset from the focus and intersecting said linear axis, said first light emitting die being positioned intermediate said second light emitting die and said third light emitting die, and said plurality of light emitting dies emitting light of at least said first and second color and a third color.

11. The method of generating light emission patterns of different colors of claim 10, further comprising:

selecting the first die to emit light of the third color in a third pre-determined number of said plurality of light generating modules; and arranging said first, second, and third light emitting dies so that the color not emitted at said focus is emitted offset from the focus of one beam forming optic in a first direction and emitted offset from the focus of another beam forming optic in a second direction opposite the first direction.

* * * * *